United States Patent
Ohse et al.

(10) Patent No.: US 9,893,162 B2
(45) Date of Patent: Feb. 13, 2018

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Naoyuki Ohse, Tsukuba (JP); Takumi Fujimoto, Matsumoto (JP); Yoshiyuki Sakai, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/438,129

(22) Filed: Feb. 21, 2017

(65) Prior Publication Data
US 2017/0271472 A1  Sep. 21, 2017

(30) Foreign Application Priority Data
Mar. 16, 2016  (JP) .................................. 2016-053129

(51) Int. Cl.
| | | |
|---|---|---|
| H01L 21/04 | (2006.01) | |
| H01L 29/66 | (2006.01) | |
| H01L 29/16 | (2006.01) | |
| H01L 29/78 | (2006.01) | |
| H01L 21/265 | (2006.01) | |
| H01L 21/324 | (2006.01) | |
| H01L 29/45 | (2006.01) | |

(52) U.S. Cl.
CPC .... *H01L 29/66068* (2013.01); *H01L 21/0485* (2013.01); *H01L 21/26513* (2013.01); *H01L 21/324* (2013.01); *H01L 29/1608* (2013.01); *H01L 29/45* (2013.01); *H01L 29/7827* (2013.01)

(58) Field of Classification Search
CPC .... H01L 21/324; H01L 21/0485; H01L 29/45
See application file for complete search history.

(56) References Cited

FOREIGN PATENT DOCUMENTS

| JP | H09-82663 A | 3/1997 |
|---|---|---|
| JP | 2005-276978 A | 10/2005 |

OTHER PUBLICATIONS

Kazuo Arai and Sadashi Yoshida, "Fundamentals and Applications of SiC elements", Ohmsha, Ltd., pp. 112-113, Mar. 26, 2003.

*Primary Examiner* — Amar Movva
(74) *Attorney, Agent, or Firm* — Rabin & Berdo, P.C.

(57) ABSTRACT

Heat treatment is performed twice with respect to a silicon carbide substrate. In the first heat treatment process, after Si ions are implanted in a front surface of the silicon carbide substrate, the silicon carbide substrate contacting an electrode film is heat treated, and a precursor layer of a thermal reaction layer is formed between the electrode film and the silicon carbide substrate that includes a high-concentration impurity region. Thereafter, the unreacted electrode film remaining on the precursor layer of the thermal reaction layer and on an oxide film is removed. In the subsequent second heat treatment process, the silicon carbide substrate from which the unreacted electrode film has been removed is heat treated and the precursor layer of the thermal reaction layer at a bottom area of the opening is converted into the thermal reaction layer.

6 Claims, 3 Drawing Sheets

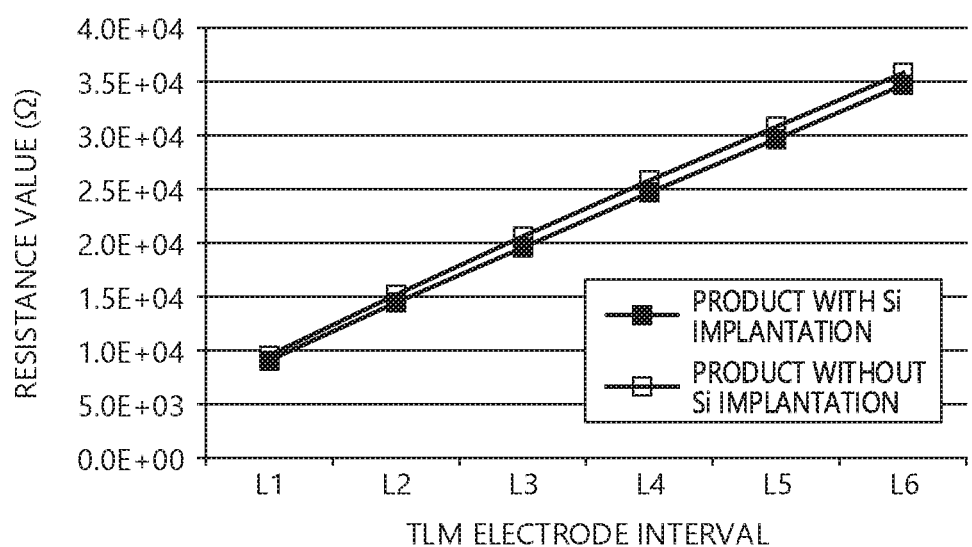
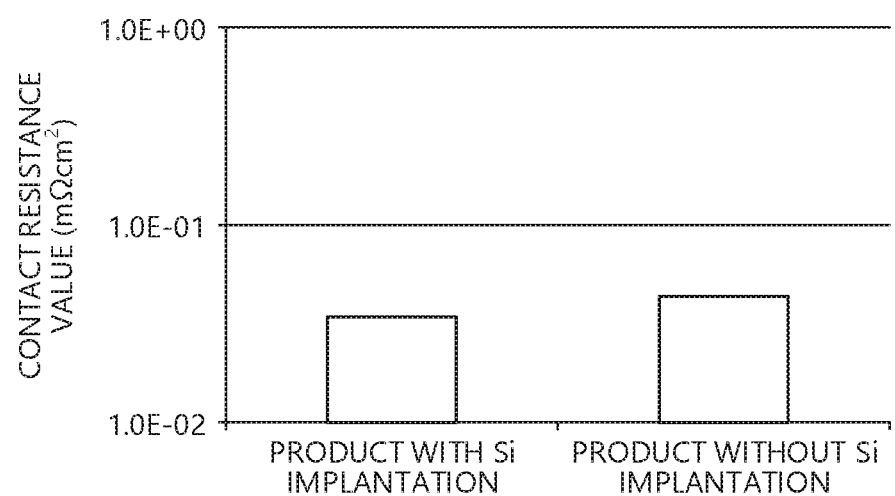

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of a prior Japanese Patent Application No. 2016-053129, filed on Mar. 16, 2016, the entire contents of which are incorporated herein by reference.

BACKGROUND OF THE INVENTION

1. Field of the Invention

The embodiments discussed herein relate to a silicon carbide (SiC) semiconductor device and a method of manufacturing a silicon carbide semiconductor device using a semiconductor material such as silicon carbide.

2. Description of the Related Art

Recently, SiC has gained attention as a semiconductor material to replace silicon (hereinafter, Si). SiC has a bandgap of 3.25 eV for 4H-SiC, nearly 3 times the bandgap (1.12 eV) of Si, and therefore, can increase the upper limit operating temperature. Further, the dielectric breakdown field strength is 3.0 MV/cm for 4H-SiC, about 10 times greater than the dielectric breakdown field strength (0.25 MV/cm) of Si and therefore, the ON resistance, which exerts an effect by the third power of the reciprocal of the dielectric breakdown field strength, is reduced, enabling power loss in an always-ON state to be reduced. Further, since the thermal conductivity is 4.9 W/cmK for 4H-SiC, three times higher than the thermal conductivity (1.5 W/cmK) of Si, an advantage is obtained in that the size of a cooling apparatus having a high thermal cooling effect can be reduced. Since the saturated drift velocity is large at $2 \times 10^7$ cm/s, high-speed operation is also favorable. Because of these points, the application of SiC to power semiconductor elements (hereinafter, called power devices), high-frequency devices, high-temperature operating devices, and the like is expected.

At present, metal-oxide-semiconductor field-effect transistors (MOSFETs), pn diodes, Schottky diodes, and the like are being prototyped, and devices exceeding Si characteristics related the dielectric breakdown voltage and ON resistance (ON resistance=forward voltage/forward current at the time of energization) are appearing one after another. In the creation of these elements, a technique of controlling the conductivity type and carrier concentration in selected regions is necessary. Such methods include thermal diffusion methods and ion implantation methods. Since the impurity diffusion coefficient for SiC is extremely small, thermal diffusion methods, which are widely used in Si semiconductor devices, are difficult to apply to SiC. Therefore, with SiC, normally, an ion implantation method is used as a carrier concentration control technique. Implanted as an ion species, nitrogen (hereinafter, indicated as "N") and phosphorus (hereinafter, indicated as "P") are often used as an n-type and aluminum (hereinafter, indicated as "Al") or boron (hereinafter, indicated as "B") is often used as a p-type.

Large-capacity, high-voltage power devices have a vertical element structure where voltage is applied in a vertical direction of the element, i.e., between a front surface and a rear surface of the element and current is controlled between the front surface and the rear surface. Therefore, configuration is such that an electrode is on the front surface and on the rear surface of the semiconductor element. For example, in the case of a Schottky diode, configuration is such that a Schottky electrode is on the front surface (first main surface) of the element and an ohmic electrode is on the rear surface (second main surface). Further, in the case of a vertical MOSFET, configuration is such that a source electrode and a gate electrode substrate are on the front surface and a drain electrode that is an ohmic electrode is on the rear surface.

An important element in reducing the ON resistance of such a power device using SiC is a reduction of a contact resistance $\rho c$ of the ohmic contact. In particular, to reduce the ON resistance, a method of subdividing and arranging in a high density on the SiC substrate, a main electrode region of the power device is employed. In reducing the ON resistance of a micro-sized power device, obtaining a low contact resistance $\rho c$ in a minute opening becomes extremely important.

As a method of forming the above ohmic electrode in a silicon carbide semiconductor device constituted by a SiC substrate, a method of performing a silicide process involving heat treatment at about 1000 degrees C. to form a silicide film on the SiC substrate, after an electrode film of Ni or Ti, etc. is vapor deposited on the SiC substrate is typically performed to obtain an ohmic electrode having a low resistance (small potential barrier) contact with both an n-type SiC and a p-type SiC (for example, refer to "Fundamentals and Applications of SiC elements", Ohmsha, Ltd. p. 112).

SUMMARY OF THE INVENTION

According to one aspect of the present invention, a method of manufacturing a silicon carbide semiconductor device includes preparing a semiconductor substrate of a first conductivity type and a semiconductor deposition layer of the first conductivity type deposited on the semiconductor substrate and having an impurity concentration that is lower than that of the semiconductor substrate; forming a high-concentration impurity region on a front surface of the semiconductor deposition layer; forming an insulating film on the front surface of the semiconductor deposition layer; forming an opening in the insulating film on the high-concentration impurity region; ion implanting Si atoms in the opening; making an electrode film contact the high-concentration impurity region in the opening; performing a first heat treatment process of heat treating the semiconductor substrate in contact with the electrode film, so as to form a precursor layer of a thermal reaction layer between the electrode film in the opening and the semiconductor substrate including the high-concentration impurity region; removing the electrode film that remains unreacted on the insulating film and the precursor layer of the thermal reaction layer; performing a second heat treatment process of heat treating the semiconductor substrate after the electrode film that remains unreacted has been removed, so as to convert the precursor layer of the thermal reaction layer at a bottom of the opening into a thermal reaction layer; and disposing a wiring conductor on top of the precursor layer of the thermal reaction layer after the electrode film that remains unreacted has been removed.

In the method of manufacturing a silicon carbide semiconductor device, the first heat treatment process is executed at a temperature from 400 degrees C. to 600 degrees C.

In the method of manufacturing a silicon carbide semiconductor device, the second heat treatment process is performed at a temperature from 900 degrees C. to 1200 degrees C.

In the method of manufacturing a silicon carbide semiconductor device, the Si atoms are ion implanted after the opening is formed after the insulating film is formed, without peeling of a resist material.

In the method of manufacturing a silicon carbide semiconductor device, the electrode film is formed by one metal of: or by a metal film, an alloy film, a compound film or, a composite film or stacked film selected from one or more of: nickel (Ni), cobalt (Co), titanium (Ti), chromium (Cr), tantalum (Ta), tungsten (W), and molybdenum (Mo).

According to another aspect of the present invention, a silicon carbide semiconductor device includes a semiconductor substrate of a first conductivity type; a semiconductor deposition layer of the first conductivity type, deposited on the semiconductor substrate and having an impurity concentration that is lower than that of the semiconductor substrate; a high-concentration impurity region formed on a front surface of the semiconductor deposition layer; an insulating film forming on the front surface of the semiconductor deposition layer; an opening formed in the insulating film on the high-concentration impurity region and in which Si atoms are ion implanted; a thermal reaction layer formed so as to contact the high-concentration impurity region; and a wiring conductor disposed on top of the thermal reaction layer, where a side wall gap is present between the thermal reaction layer and the insulating film.

In the silicon carbide semiconductor device, a main surface of the semiconductor substrate of the thermal reaction layer is lower than a main surface of the semiconductor substrate beneath the insulating film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a graph depicting the relationship of resistance values and a TLM element electrode interval of the silicon carbide semiconductor device of the first example;

FIG. 4 is a graph of contact resistance values of the silicon carbide semiconductor device of the first example and of a comparison example;

DETAILED DESCRIPTION OF THE INVENTION

Figure 1:
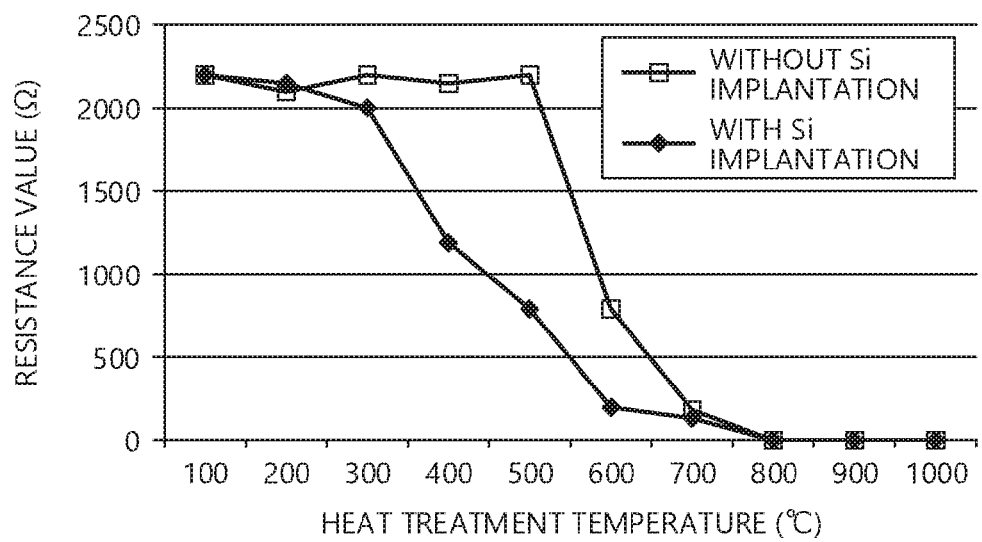
FIG. 1 is a graph of heat treatment characteristics of a silicon carbide semiconductor device according to an embodiment.

Embodiments of according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

In an embodiment of the present invention, heat treatment is carried out twice with respect to a silicon carbide substrate. In a first heat treatment process, after Si ions are implanted, the silicon carbide substrate contacting an electrode film is heat treated, and a precursor layer of a thermal reaction layer (hereinafter referred to as a thermal-reaction-layer precursor layer) is formed between the electrode film and the silicon carbide substrate, which includes a high-concentration impurity region. Thereafter, the unreacted electrode film remaining on an oxide film and on the thermal-reaction-layer precursor layer is removed. Thereafter, in a second heat treatment process, the silicon carbide substrate from which the unreacted electrode film has been removed is heat treated and the thermal-reaction-layer precursor layer at a bottom of an opening is converted into a thermal reaction layer.

A first heat treatment temperature and period of the first heat treatment process were derived from results obtained by performing the following experiment. On a 4H-SiC substrate (silicon carbide substrate) of about 1 cm per side, a 60 nm Ni film was formed as an electrode film by a sputtering method to have a given constant distance. In the sputtering method after the Ni film was formed, the Ni film was divided into 2 by a certain method.

Thereafter, the silicon carbide substrate was heat treated for 2 minutes in an Ar atmosphere in a rapid thermal annealing (RTA) apparatus. The temperature at this time was from 400 degrees C. to 1000 degrees C., in increments of 100 degrees C. Similarly, a sample in which Si ion implantation was performed beneath the Ni film was created and the resistance value between the Ni films having a constant distance was measured.

FIG. 1 is a graph of heat treatment characteristics of a silicon carbide semiconductor device according to an embodiment. The horizontal axis represents heat treatment temperature and the vertical axis represents resistance values. In the case of no Si implantation, the resistance begins to gradually decrease from 600 degrees C. and at 900 degrees C. or higher, the resistance value stops decreasing and becomes stable. On the other hand, in the case of Si implantation, the resistance value begins to decrease from 400 degrees C. This difference in reaction temperature is thought to be from enhanced reactivity of Ni and Si consequent to an increased content of Si in a contact formation portion and the collapse of the crystal structure of the SiC surface layer by the implantation of Si. The lowest resistance value was substantially the same irrespective of whether Si implantation is performed.

From these results, it was found that in the case of no Si implantation, the reaction of the Ni film and SiC begins at about 600 degrees C. and when Si is implanted, the reaction begins from about 400 degrees C. In the present invention, a reactant of the SiC and the Ni film that is an electrode film may be used as a thermal-reaction-layer precursor layer. However, in either case, a sufficient silicide layer is not formed and therefore, to obtain low contact resistance, a second heat treatment at a temperature of 900 degrees C. or higher is necessary. At this time, the second heat treatment temperature may be preferably 1200 degrees C. or lower consequent to heating capacity limitations of a typical heat treatment apparatus.

Here, heat treatment (first heat treatment) in a state where an interlayer insulating film and the Ni film are contacting each other is sufficient at 400 degrees C. to 600 degrees C. for several minutes. Since this temperature is about the same temperature region as a silicide process applied for a Si semiconductor, the SiC and the Ni film may be reacted without concern of the interlayer insulating film being affected. When heat treatment exceeding a temperature of 600 degrees C. is performed for a long period, Ni may diffuse into the interlayer insulating film and therefore, is not desirable. Further, when the period of the heat treatment is too short, the thermal-reaction-layer precursor layer is thin and therefore, the thermal-reaction-layer precursor layer is also removed concurrently with the subsequent removal of the unreacted electrode film. For these reasons, the heat treatment period may be preferably longer than 2 minutes and shorter than 15 minutes.

From the results above, by implanting Si ions and performing heat treatment at 400 degrees C. or higher, the SiC and the Ni film (electrode film) react, enabling formation of the thermal-reaction-layer precursor layer. Further, it was found that by heat treatment at 600 degrees C. or lower, the Ni film may be reacted with the SiC alone without diffusion into an oxide film of the interlayer insulating film, etc. Furthermore, even when Si was implanted in the interlayer insulating film, diffusion of the Ni film into the interlayer insulating film by heat treatment of 600 degrees C. after formation of the Ni film was not observed.

Figure 2:
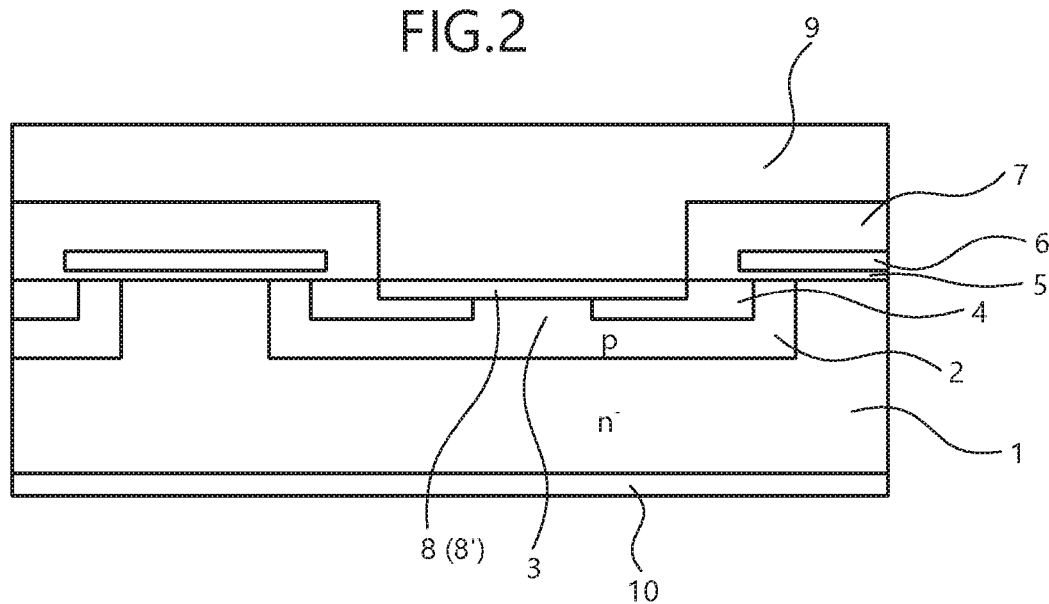
FIG. 2 is a cross-sectional view of a silicon carbide semiconductor device of a first example of the present invention.

FIG. 2 is a cross-sectional view of a silicon carbide semiconductor device of a first example of the present invention. Concerning the silicon carbide semiconductor device of the embodiment above, a MOSFET and a transfer length method (TLM) element were produced.

In particular, on a 4H-SiC n-type substrate (semiconductor substrate of a first conductivity type), an n⁻-type silicon carbide substrate 1 was prepared by forming, by epitaxial growth, a high-resistance semiconductor deposition layer (semiconductor deposition layer of the first conductivity type) having an n-type doping concentration of $2 \times 10^{15}$ cm$^{-3}$ and a thickness of 10 μm. Next, an ion implantation mask formed from a silicon oxide film having a thickness of 1.5 μm was formed and Al ions were implanted at a temperature of 500 degrees C., forming a p-type well region 2 of a second conductivity type. Here, the doping concentration was $1 \times 10^{16}$ cm$^{-3}$ and the implantation depth was 500 nm.

Next, an ion implantation mask formed by a silicon oxide film having an opening in a center of the p-type well region 2 was formed and Al ions were implanted, forming a p-type contact region 3. Here, the doping concentration was $1 \times 10^{19}$ cm$^{-3}$.

An ion implantation mask formed from a silicon oxide film having openings at side portions of the p-type contact region 3 in the p-type well region 2 was formed and phosphorus (P) ions were implanted, forming n-type source regions 4 having a doping concentration of $1 \times 10^{19}$ cm$^{-3}$. The p-type contact region 3 and the n-type source regions 4 formed here form the high-concentration impurity region.

Next, the n⁻-type silicon carbide substrate 1 was inserted into an annealing furnace and in an Ar atmosphere, an activation process was performed at 1700 degrees C. for 5 minutes.

Next, the n⁻-type silicon carbide substrate 1 was inserted into a quartz tube, oxygen was passed through pure water, a thermal oxidation process was performed at 1200 degrees C. in an atmosphere including water vapor, and a silicon oxide film to become a gate insulating film 5 was grown on the front surface (a front surface of an n⁻-type silicon carbide epitaxial layer) of the n⁻-type silicon carbide substrate 1. Here, the thickness of the silicon oxide film was 70 nm.

Next, a poly-silicon film doped with phosphorus and having a thickness of 0.5 μm was formed as a gate electrode 6 by a chemical vapor deposition (CVD) method. The gate electrode 6 was formed from a region across adjacent p-type well regions 2 to a region of the p-type well region 2 between the n⁻-type silicon carbide substrate 1 and the n-type source region 4.

Next, an interlayer insulating film 7 was formed in a region covering the gate electrode 6. In particular, by a CVD method, a phospho silicate glass (PSG) film having a thickness of 1 μm was formed. Thereafter, by photolithography, forming a resist mask with an opening (second opening), the interlayer insulating film 7 and the gate insulating film 5 beneath the interlayer insulating film 7 were patterned by the resist mask and openings (first opening) were formed. In each opening, the high-concentration impurity region was exposed to become a contact formation portion. Etching of the PSG film and the silicon oxide film was performed by reactive ion etching (RIE) using a mixed gas of CHF₃, CF₄, and Ar.

Next, the interlayer insulating film 7 was used as a mask and Si atoms were implanted in each opening. Ion implantation conditions were 50 nm and $3.0 \times 10^{19}$ cm$^{-3}$. Here, although Si ions are implanted in the interlayer insulating film 7 as well, the reliability is not affected because the Si ions are implanted in only a several tens of nm of the uppermost surface of the interlayer film of a thickness of about 1.0 μm.

Next, on the entire surface of the n⁻-type silicon carbide substrate 1 including the openings and on the interlayer insulating film 7, a Ni film of a thickness of 60 nm was formed as the electrode film by a sputtering method. Thereafter, the first heat treatment was performed in a vacuum for 2 minutes at 500 degrees C., forming a thermal-reaction-layer precursor layer 8 only at an interface of the Ni film and the high-concentration impurity region Si-implanted in the openings. Further, at this time, no reaction or diffusion occurs at an interface of the Ni film and the interlayer insulating film 7 implanted with Si ions.

Next, after the unreacted Ni film was removed by phosphoric acid+nitric acid+acetic acid at 60 degrees C., the second heat treatment was performed with respect to the n⁻-type silicon carbide substrate 1. In particular, the n⁻-type silicon carbide substrate 1 was inserted into a RTA furnace and in the measurement in an Ar atmosphere with thermal coupling to a carbon susceptor, the temperature was increased at a rate of 15 degrees C. per second, to 950 degrees C. and was held for 2 minutes. As a result, the reactant of the SiC with the Ni film pattern, which is the thermal-reaction-layer precursor layer 8, and the Ni film pattern for TLM measurement was converted into a silicide and was converted into a thermal reaction layer 8' having a low resistance.

Next, an Al film having a thickness of 5 μm was formed by a sputtering method, and a source contact pad, a gate contact pad, and TLM wiring conductor (extraction electrode) 9 were formed. Next, on a rear side of the n⁻-type silicon carbide substrate 1, a Ti film of 100 nm and gold (Au) film of 200 nm were formed by a vapor deposition method to be a rear surface electrode 10.

By the processes above, a MOSFET element was produced and in a TLM pattern region, measurement of the contact resistance of the n-type source region 4 (high-concentration impurity region) and the thermal reaction layer 8' was performed and from the measured values in the wafer surface, an average value was calculated.

Further, as a comparison example, a TLM element created by normal processes without performing Si ion implantation was also created and the resistance value thereof was measured. These normal processes are the same as those in the first example except that after forming openings in the interlayer insulating film, Ni sputtering is performed without performing Si ion implantation, the Ni is patterned, and heat treatment at 975 degrees C. for 2 minutes is performed.

FIG. 3 is a graph depicting the relationship of resistance values and the TLM element electrode interval of the silicon carbide semiconductor device of the first example of the present invention. FIG. 4 is a graph of contact resistance values of the silicon carbide semiconductor device of the first example of the present invention and of the comparison example.

From the resistance values between TLM element electrodes depicted in FIG. 3, it is found that in both products with Si ion implantation and without Si ion implantation, TLM characteristics may be correctly measured. Concerning the contact resistance values depicted in FIG. 4 and calculated from the results above, it is found that for products with Si implantation, irrespective of omission of the Ni patterning process, contact resistance values equal to that of products without Si implantation are obtained. These results show that according to the present invention, element miniaturization is possible without raising the contact resistance value.

Figure 5:
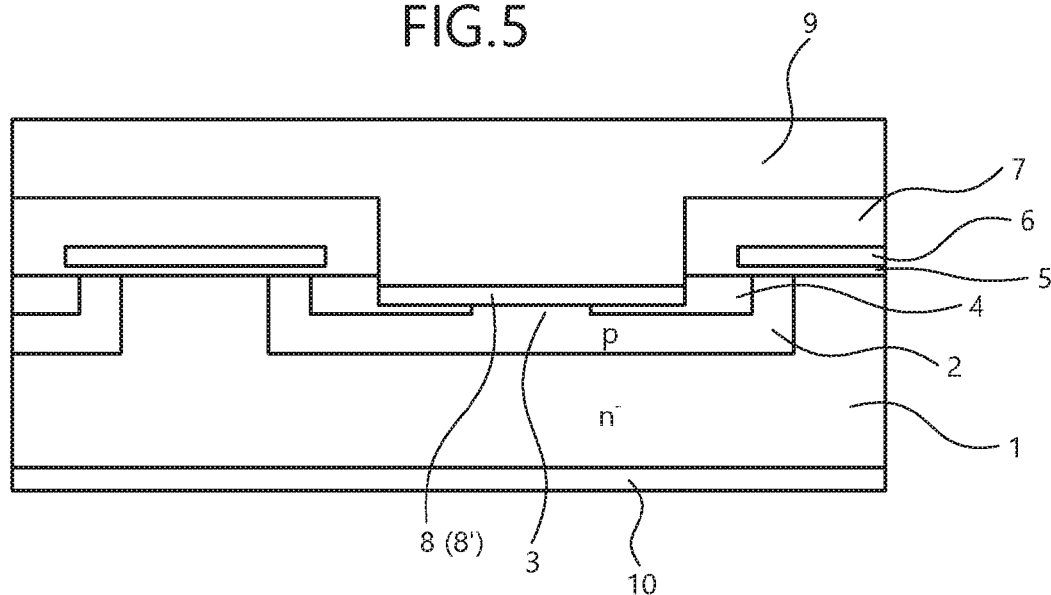
FIG. 5 is a cross-sectional view of a silicon carbide semiconductor device of a second example of the present invention.

FIG. 5 is a cross-sectional view of a silicon carbide semiconductor device of a second example of the present invention. The second example of the present invention is obtained by improving the first example. In the second example, in the patterning of the interlayer insulating film 7, the amount of over-etching is increased and the SiC front surface (main surface of the n$^-$-type silicon carbide substrate 1) of the contact formation portion is devised to be lower than the position of the SiC front surface beneath the interlayer insulating film 7.

According to the second example, the same effects as the first example are obtained. Further, according to the second example, when the second heat treatment is performed, the distance between the interlayer insulating film 7 and the thermal reaction layer 8' (side wall gap) may be ensured, enabling greater reliability of the interlayer insulating film 7 to be ensured. This is achieved because when Si ions are implanted substantially orthogonally, for the most part, Si ions are not implanted in the side wall portion and thus, the thermal-reaction-layer precursor layer 8 is not formed.

Figure 6:
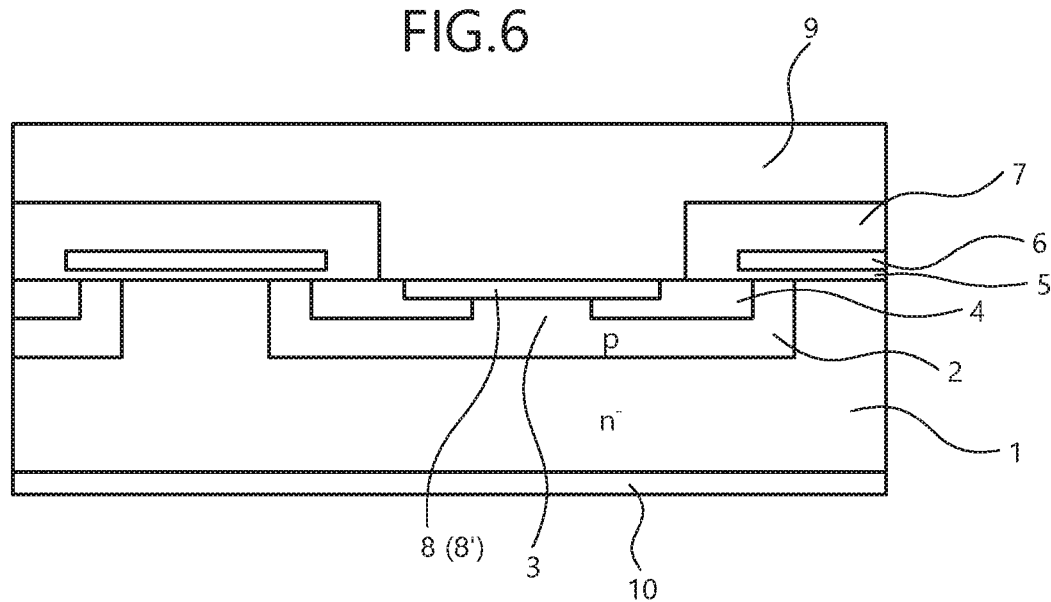
FIG. 6 is a cross-sectional view of a silicon carbide semiconductor device of a third example of the present invention.

FIG. 6 is a cross-sectional view of a silicon carbide semiconductor device of a third example of the present invention. The third example of the present invention is obtained by improving the first example. In the third example, in the etching of the interlayer insulating film 7, Si ion implantation is performed without peeling a resist material.

At this time, provided the ion implantation conditions described in the first example are in place, the resist material is not penetrated, however, even assuming that the resist material is penetrated by Si ions and Si is implanted in the interlayer insulating film 7, this is not a problem. It is a well-known phenomenon that the oxide film beneath the resist material is side etched depending on the etching conditions of the interlayer insulating film 7.

Therefore, by performing Si ion implantation without peeling the resist material, Si ions are implanted only directly under the opening of the resist material. Portions in which Si ions are not implanted do not react with the Ni film even in the first heat treatment process of 500 degrees C. and therefore, the side wall gap may be formed between the side wall of the interlayer insulating film 7 and the ion implantation region, i.e., a Ni silicide formation portion. As a result, the interlayer insulating film 7 having a high reliability may be formed. The resist film on the interlayer insulating film 7 is peeled after the Si ion implantation.

In the description above, the present invention is not limited to the embodiments above and various modifications within the scope of the present invention are possible. For example, the present invention is applicable when the p-type and the n-type are interchanged, and when the silicon carbide substrate and an epitaxial layer grown on a main front surface of the silicon carbide substrate are of differing conductivity types. Further, the present invention is applicable when as an electrode film, one metal of: or a metal film, an alloy film, a compound film or, a composite film or stacked film selected from one or more of: nickel (Ni), cobalt (Co), titanium (Ti), chromium (Cr), tantalum (Ta), tungsten (W), molybdenum (Mo), etc. is used.

However, in the traditional techniques above, a gap (side wall gap) between the interlayer insulating film and the electrode film is necessary. This side wall gap is necessary to prevent degradation of the film quality caused by the electrode film diffusing to the interlayer insulating film when heat treatment of 1000 degrees C. is performed for ohmic contact formation. However, the cells increase in size by this side wall gap and in a power device in which several thousands to several tens of thousands of cells are arranged, the area loss increases.

With respect to this problem, techniques in Japanese Patent Laid-Open Publication Nos. H9-82663 and 2005-276978 have been proposed. Nonetheless, when the technique in Japanese Patent Laid-Open Publication No. H9-82663 is applied to an actual device, Ni is implanted in the interlayer insulating film causing the film quality to degrade and therefore, formation of a mask material to block Ni and patterning are additionally required. Further, in the process described in Japanese Patent Laid-Open Publication No. 2005-276978, the electrode film on the interlayer insulating film is subject to heat treatment at 600 degrees C. for 3 hours causing a problem in that the reliability of the interlayer insulating film decreases.

According to the invention described above, since the ion species implanted in the openings of the insulating film is Si, without causing degradation of the interlayer insulating film and without formation or patterning of a mask material for the Si ion implantation, the reactivity of the contact formation portion and electrode film may be increased. For example, in the first heat treatment process, processing at 500 degrees C. for 2 minutes is performed and in the second heat treatment process, processing at 950 degrees C. for 2 minutes is performed, enabling the reactivity of the contact formation portion and the electrode film to be improved.

According to the present invention, an effect is achieved in that the reliability of the interlayer insulating film is maintained while enabling easy realization of an ohmic electrode compatible with element miniaturization.

As described, the silicon carbide semiconductor device according to the present invention, for example, is useful for power semiconductor elements used in engine control, industrial motor control, and in power semiconductor elements of power devices and the like; and is particularly suitable for compact vertical semiconductor elements in which current flows from the front surface side of the semiconductor substrate to the rear surface side.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising:

preparing a semiconductor substrate of a first conductivity type on which a semiconductor deposition layer of the first conductivity type is deposited, the semiconductor deposition layer having an impurity concentration lower than that of the semiconductor substrate;

forming a high-concentration impurity region having an impurity concentration higher than that of the semiconductor substrate, in a front surface of the semiconductor deposition layer;

forming an insulating film on the front surface of the semiconductor deposition layer;

forming a first opening in the insulating film on the high-concentration impurity region;

ion implanting Si atoms, through the first opening, in the high-concentration impurity region;

forming an electrode film in contact with the high-concentration impurity region in the area of the first opening;

performing a first heat treatment process on the semiconductor substrate after forming the electrode film, thereby to form a precursor layer of a thermal reaction layer between the electrode film and the high-concentration impurity region on which the first opening is formed;

removing a portion of the electrode film that remains unreacted on the insulating film and the precursor layer of the thermal reaction layer, after said performing the first heat treatment;

performing a second heat treatment process on the semiconductor substrate after the portion of electrode film that remains unreacted has been removed, thereby to convert the precursor layer at the area of the first opening into a thermal reaction layer; and disposing a wiring conductor on the thermal reaction layer.

2. The method of manufacturing a silicon carbide semiconductor device according to claim 1, wherein the first heat treatment process is performed at a temperature in the range 400 degrees C. to 600 degrees C.

3. The method of manufacturing a silicon carbide semiconductor device according to claim 2, wherein the second heat treatment process is performed at a temperature in the range 900 degrees C. to 1200 degrees C.

4. The method of manufacturing a silicon carbide semiconductor device according to claim 1, wherein the ion implanting Si atoms includes
   forming a resist mask having a second opening that exposes the high-concentration impurity region, and
   peeling the resist mask after the ion implanting Si atoms is performed.

5. The method of manufacturing a silicon carbide semiconductor device according to claim 1, wherein the electrode film is formed by one metal selected from among the metals nickel (Ni), cobalt (Co), titanium (Ti), chromium (Cr), tantalum (Ta), tungsten (W), and molybdenum (Mo).

6. The method of manufacturing a silicon carbide semiconductor device according to claim 1, wherein the electrode film is formed by a metal film, an alloy film, a compound film or, a composite film or stacked film selected from one or more of:
   nickel (Ni), cobalt (Co), titanium (Ti), chromium (Cr), tantalum (Ta), tungsten (W), and molybdenum (Mo).

* * * * *